United States Patent
Smaini et al.

(10) Patent No.: US 10,128,795 B2
(45) Date of Patent: Nov. 13, 2018

(54) POLAR LOOP MODULATION TECHNIQUES FOR WIRELESS COMMUNICATION

(71) Applicant: Apple Inc., Cupertino, CA (US)

(72) Inventors: Lydi Smaini, San Jose, CA (US); Tarik Tabet, Los Gatos, CA (US); Moustafa M. Elsayed, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/398,114

(22) Filed: Jan. 4, 2017

(65) Prior Publication Data
US 2017/0195113 A1 Jul. 6, 2017

Related U.S. Application Data

(60) Provisional application No. 62/275,461, filed on Jan. 6, 2016.

(51) Int. Cl.
H03C 3/09 (2006.01)
H03C 5/00 (2006.01)
H04L 27/00 (2006.01)

(52) U.S. Cl.
CPC ........... *H03C 3/0916* (2013.01); *H03C 3/095* (2013.01); *H03C 3/0941* (2013.01); *H03C 3/0966* (2013.01); *H03C 5/00* (2013.01); *H04L 27/00* (2013.01)

(58) Field of Classification Search
CPC .... H03C 3/0916; H03C 3/0941; H03C 3/095; H03C 3/0966; H03C 5/00; H04L 27/00
See application file for complete search history.

(56) References Cited

U.S. PATENT DOCUMENTS

| | | | |
|---|---|---|---|
| 7,421,037 | B2 | 9/2008 | Shakeshaft et al. |
| 8,634,512 | B2 | 1/2014 | Leung et al. |
| 8,982,792 | B2 | 3/2015 | Menkhoff |
| 8,982,972 | B2 | 3/2015 | Menkhoff |
| 8,983,391 | B2 | 3/2015 | Khoshnevis et al. |
| 9,000,858 | B2 | 4/2015 | Sun et al. |
| 2006/0291589 | A1* | 12/2006 | Eliezer ............ H03C 3/40 375/302 |
| 2007/0014382 | A1* | 1/2007 | Shakeshaft ........ H03F 1/0233 375/297 |

(Continued)

*Primary Examiner* — Sophia Vlahos
(74) *Attorney, Agent, or Firm* — Meyertons Hood Kivlin Kowert & Goetzel, P.C.; Jeffrey C. Hood

(57) ABSTRACT

This disclosure relates to an apparatus, system, and method for generating uplink transmissions using a polar architecture including a phase locked loop with potential for two point injection. According to some embodiments, frequency resources allocated for a transmission may be determined. A cartesian baseband signal may be generated for the uplink transmission. The cartesian baseband signal may be converted to a polar baseband signal, including a baseband phase signal and an amplitude signal. Modulation parameters, potentially including whether to use one point injection or two point injection with a phase locked loop, may be determined. The baseband phase signal may be upconverted to an RF phase signal according to the determined modulation parameters. The RF phase signal may be amplified according to the amplitude signal to produce an RF signal. The RF signal may be transmitted.

20 Claims, 14 Drawing Sheets

(56) References Cited

U.S. PATENT DOCUMENTS

| | | | |
|---|---|---|---|
| 2007/0205831 A1* | 9/2007 | Yoshikawa | H03C 3/0925 331/16 |
| 2009/0206940 A1* | 8/2009 | Collados Asensio | H03C 3/40 332/103 |
| 2011/0316595 A1* | 12/2011 | Bolton | H03L 1/022 327/156 |
| 2012/0063405 A1* | 3/2012 | Han | H04L 5/0023 370/329 |
| 2013/0287065 A1* | 10/2013 | Sun | H03C 3/0941 375/146 |
| 2016/0218900 A1 | 7/2016 | Smaini et al. | |

* cited by examiner

POLAR LOOP MODULATION TECHNIQUES FOR WIRELESS COMMUNICATION

PRIORITY INFORMATION

This application claims priority to U.S. provisional patent application Ser. No. 62/275,461, entitled "Polar Loop Modulation Techniques for Wireless Communication," filed Jan. 6, 2016, which is hereby incorporated by reference in its entirety as though fully and completely set forth herein.

FIELD

The present application relates to wireless devices, and more particularly to a system and method for generating signals for wireless communication using polar loop modulation.

DESCRIPTION OF THE RELATED ART

Wireless communication systems are rapidly growing in usage. Additionally, there exist numerous different wireless communication technologies and standards. Some examples of wireless communication standards include GSM, UMTS (associated with, for example, WCDMA or TD-SCDMA air interfaces), LTE, LTE Advanced (LTE-A), HSPA, 3GPP2 CDMA2000 (e.g., 1xRTT, 1xEV-DO, HRPD, eHRPD), IEEE 802.11 (WLAN or Wi-Fi), IEEE 802.16 (WiMAX), Bluetooth, and others.

In LTE, single-carrier frequency division multiple access (SC-FDMA) is used in the uplink while orthogonal frequency division multiple access (OFDMA) is used in the downlink. Typically, SC-FDMA signals are shifted to their allocated resource blocks in the frequency domain in a process which results in a data path having a bandwidth much greater than the bandwidth of the allocated resource blocks themselves, particularly if the allocated resource blocks are close to an outer edge of the frequency channel in which they are located.

SUMMARY

Embodiments are presented herein of methods for cellular devices to utilize polar loop modulation when generating signals for uplink communications, such as to perform localized SC-FDMA transmissions, and of devices configured to implement the methods.

In some instances, the frequency resources used for a transmission from a transmitting device to a receiving device may only occupy a subset of the total frequency resources of a frequency channel used for wireless communication between the transmitting and receiving devices. Additionally, at least in some circumstances it may be possible for those frequency resources to be offset from the center frequency of the frequency channel. SC-FDMA communication in LTE is one example of such a paradigm in which resource allocations that are offset from the center frequency of a frequency channel are possible.

According to the techniques disclosed herein, it may be possible to provide a transmitter architecture capable of operating in a highly efficient manner in such (and potentially other) circumstances. For example, a polar architecture may be used in which a baseband signal remains located (e.g., centered) around DC (e.g., rather than shifting the baseband signal such that the center frequency of the frequency channel is located around DC) through any frequency domain processing, and in which the phase portion of the signal is shifted in the temporal domain (e.g., prior to up-conversion to an RF phase signal).

At least in some instances, the polar architecture may include a phase locked loop (PLL). It may be possible to use either or both of single point injection or two point injection with the PLL. Such an architecture may flexibly provide support for a range of waveform widths, potentially including wider bandwidths than conventionally possible with a PLL, waveforms located relatively far from the center frequency of the channel on which they are transmitted, etc.

The techniques described herein may be implemented in and/or used with a number of different types of devices, including but not limited to cellular base stations, cellular phones, tablet computers, wearable computing devices, portable media players, and any of various other computing devices.

This Summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

A better understanding of the present subject matter can be obtained when the following detailed description of the embodiments is considered in conjunction with the following drawings, in which.

Figure 1:
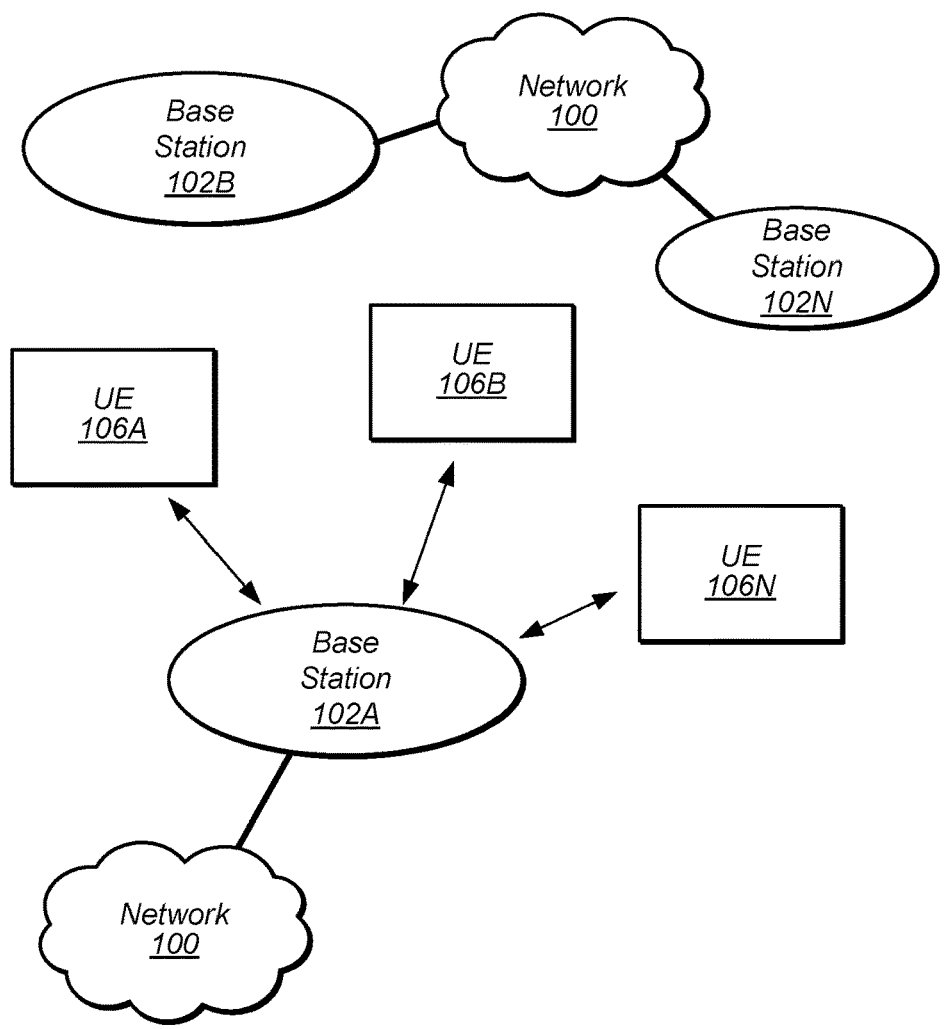
FIG. 1 illustrates an exemplary (and simplified) wireless communication system, according to some embodiments.

While the features described herein may be susceptible to various modifications and alternative forms, specific embodiments thereof are shown by way of example in the drawings and are herein described in detail. It should be understood, however, that the drawings and detailed description thereto are not intended to be limiting to the particular form disclosed, but on the contrary, the intention is to cover all modifications, equivalents and alternatives falling within the spirit and scope of the subject matter as defined by the appended claims.

DETAILED DESCRIPTION

Terms

The following is a glossary of terms used in this disclosure:

Memory Medium—Any of various types of non-transitory memory devices or storage devices. The term "memory medium" is intended to include an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may include other types of non-transitory memory as well or combinations thereof. In addition, the memory medium may be located in a first computer system in which the programs are executed, or may be located in a second different computer system, which connects to the first computer system over a network, such as the Internet. In the latter instance, the second computer system may provide program instructions to the first computer for execution. The term "memory medium" may include two or more memory mediums, which may reside in different locations, e.g., in different computer systems that are connected over a network. The memory medium may store program instructions (e.g., embodied as computer programs) that may be executed by one or more processors.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

User Equipment (UE) (or "UE Device")—any of various types of computer systems devices which are mobile or portable and which performs wireless communications. Examples of UE devices include mobile telephones or smart phones (e.g., iPhone™, Android™-based phones), portable gaming devices (e.g., Nintendo DS™, PlayStation Portable™, Gameboy Advance™, iPhone™), laptops, wearable devices (e.g., smart watch, smart glasses), PDAs, portable Internet devices, music players, data storage devices, or other handheld devices, etc. In general, the term "UE" or "UE device" can be broadly defined to encompass any electronic, computing, and/or telecommunications device (or combination of devices) which is easily transported by a user and capable of wireless communication.

Wireless Device—any of various types of computer system devices which performs wireless communications. A wireless device can be portable (or mobile) or may be stationary or fixed at a certain location. A UE is an example of a wireless device.

Communication Device—any of various types of computer systems or devices that perform communications, where the communications can be wired or wireless. A communication device can be portable (or mobile) or may be stationary or fixed at a certain location. A wireless device is an example of a communication device. A UE is another example of a communication device.

Base Station—The term "Base Station" has the full breadth of its ordinary meaning, and at least includes a wireless communication station installed at a fixed location and used to communicate as part of a wireless telephone system or radio system.

Processing Element—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors.

Channel—a medium used to convey information from a sender (transmitter) to a receiver. It should be noted that since characteristics of the term "channel" may differ according to different wireless protocols, the term "channel" as used herein may be considered as being used in a manner that is consistent with the standard of the type of device with reference to which the term is used. In some standards, channel bandwidths may be variable (e.g., depending on device capability, band conditions, etc.). For example, LTE may support scalable channel bandwidths from 1.4 MHz to 20 MHz. In contrast, WLAN channels may be tens of MHz (20 to 160 MHz for WiFi) wide while Bluetooth channels may be around 1 MHz wide. Other protocols and standards may include different definitions of channels. Furthermore, some standards may define and use multiple types of channels, e.g., different channels for uplink or downlink and/or different channels for different uses such as data, control information, etc.

Band—The term "band" has the full breadth of its ordinary meaning, and at least includes a section of spectrum (e.g., radio frequency spectrum) in which channels are used or set aside for the same purpose.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Configured to—Various components may be described as "configured to" perform a task or tasks. In such contexts, "configured to" is a broad recitation generally meaning "having structure that" performs the task or tasks during operation. As such, the component can be configured to perform the task even when the component is not currently performing that task (e.g., a set of electrical conductors may be configured to electrically connect a module to another module, even when the two modules are not connected). In some contexts, "configured to" may be a broad recitation of structure generally meaning "having circuitry that" performs the task or tasks during operation. As such, the component can be configured to perform the task even when the component is not currently on. In general, the circuitry that forms the structure corresponding to "configured to" may include hardware circuits.

Various components may be described as performing a task or tasks, for convenience in the description. Such descriptions should be interpreted as including the phrase "configured to." Reciting a component that is configured to perform one or more tasks is expressly intended not to invoke 35 U.S.C. § 112, paragraph six, interpretation for that component.

Figure 2:
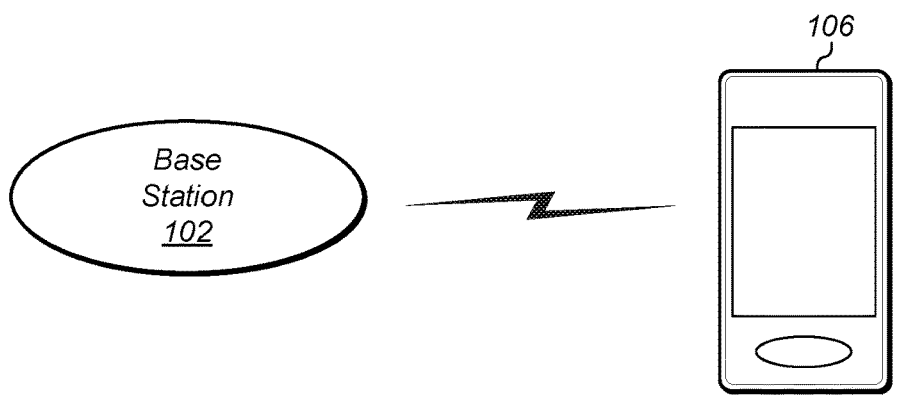
FIG. 2 illustrates a base station (BS) in communication with a user equipment (UE) device, according to some embodiments.

FIGS. 1 and 2—Communication System

FIG. 1 illustrates an exemplary (and simplified) wireless communication system, according to some embodiments. It is noted that the system of FIG. 1 is merely one example of a possible system, and embodiments may be implemented in any of various systems, as desired.

As shown, the exemplary wireless communication system includes a base station 102A which communicates over a transmission medium with one or more user devices 106A, 106B, etc., through 106N. Each of the user devices may be referred to herein as a "user equipment" (UE). Thus, the user devices 106 are referred to as UEs or UE devices.

The base station 102A may be a base transceiver station (BTS) or cell site, and may include hardware and software that enable wireless communication with the UEs 106A through 106N. The base station 102A may also be equipped to communicate with a network 100 (e.g., a core network of a cellular service provider, a telecommunication network such as a public switched telephone network (PSTN), and/or the Internet, among various possibilities). Thus, the base station 102A may facilitate communication between the user devices and/or between the user devices and the network 100.

The communication area (or coverage area) of the base station may be referred to as a "cell." The base station 102A and the UEs 106 may be configured to communicate over the transmission medium using any of various radio access technologies (RATs), also referred to as wireless communication technologies, or telecommunication standards, such as GSM, UMTS (WCDMA, TD-SCDMA), LTE, LTE-Advanced (LTE-A), HSPA, 3GPP2 CDMA2000 (e.g., 1×RTT, 1×EV-DO, HRPD, eHRPD), Wi-Fi, WiMAX etc.

Base station 102A and other similar base stations (such as base stations 102B . . . 102N) operating according to the same or a different cellular communication standard may thus be provided as a network of cells, which may provide continuous or nearly continuous overlapping service to UEs 106A-N and similar devices over a geographic area via one or more cellular communication standards.

Thus, while base station 102A may act as a "serving cell" for UEs 106A-N as illustrated in FIG. 1, each UE 106 may also be capable of receiving signals from (and possibly within communication range of) one or more other cells (which might be provided by base stations 102B-N and/or any other base stations), which may be referred to as "neighboring cells". Such cells may also be capable of facilitating communication between user devices and/or between user devices and the network 100, according to the same wireless communication technology as base station 102A and/or any of various other possible wireless communication technologies. Such cells may include "macro" cells, "micro" cells, "pico" cells, and/or cells which provide any of various other granularities of service area size. For example, base stations 102A-B illustrated in FIG. 1 might be macro cells, while base station 102N might be a micro cell. Other configurations are also possible.

Note that a UE 106 may be capable of communicating using multiple wireless communication standards. For example, a UE 106 may be configured to communicate using a wireless networking (e.g., Wi-Fi) and/or peer-to-peer wireless communication protocol (e.g., BT, Wi-Fi peer-to-peer, etc.) in addition to at least one cellular communication protocol (e.g., GSM, UMTS (WCDMA, TD-SCDMA), LTE, LTE-A, HSPA, 3GPP2 CDMA2000 (e.g., 1×RTT, 1×EV-DO, HRPD, eHRPD), etc.). The UE 106 may also or alternatively be configured to communicate using one or more global navigational satellite systems (GNSS, e.g., GPS or GLONASS), one or more mobile television broadcasting standards (e.g., ATSC-M/H or DVB-H), and/or any other wireless communication protocol, if desired. Other combinations of wireless communication standards (including more than two wireless communication standards) are also possible.

FIG. 2 illustrates user equipment 106 (e.g., one of the devices 106A through 106N) in communication with a base station 102 (e.g., one of the base stations 102A through 102N), according to some embodiments. The UE 106 may be a device with cellular communication capability such as a mobile phone, a hand-held device, a wearable device, a computer or a tablet, or virtually any type of wireless device.

The UE 106 may include a processor that is configured to execute program instructions stored in memory. The UE 106 may perform any of the method embodiments described herein by executing such stored instructions. Alternatively, or in addition, the UE 106 may include programmable hardware elements such as ASIC (Application Specific Integrated Circuit) that are configured to perform any of the method embodiments described herein, or any portion of any of the method embodiments described herein.

The UE 106 may include one or more antennas for communicating using one or more wireless communication protocols or technologies. In one embodiment, the UE 106 might be configured to communicate using either of CDMA2000 (1×RTT/1×EV-DO/HRPD/eHRPD) or LTE using a single shared radio and/or GSM or LTE using the single shared radio. The shared radio may couple to a single antenna, or may couple to multiple antennas (e.g., for MIMO) for performing wireless communications. In general, a radio transceiver may include any combination of a digital baseband processor, analog RF signal processing circuitry (e.g., including filters, mixers, oscillators, amplifiers, etc.), or digital signal processing (DSP) circuitry (e.g., for digital modulation as well as other digital processing). Similarly, the radio may implement one or more receive and transmit chains using the aforementioned hardware. For example, the UE 106 may share one or more parts of a receive and/or transmit chain between multiple wireless communication technologies, such as those discussed above.

In some embodiments, the UE 106 may specifically include circuitry for performing single carrier frequency division multiple access (SC-FDMA) communication. For example, the UE 106 may be capable of utilizing SC-FDMA communication for uplink communication as part of communicating according to the LTE radio access technology.

In some embodiments, the UE 106 may include separate (and possibly multiple) transmit and/or receive chains (e.g., including separate RF and/or digital radio components) for each wireless communication protocol with which it is configured to communicate. As a further possibility, the UE 106 may include one or more radios which are shared between multiple wireless communication protocols, and one or more radios which are used exclusively by a single wireless communication protocol. For example, the UE 106 might include a shared radio for communicating using either of LTE or 1×RTT (or LTE or GSM), and separate radios for communicating using each of Wi-Fi and Bluetooth. Other configurations are also possible.

Figure 3:
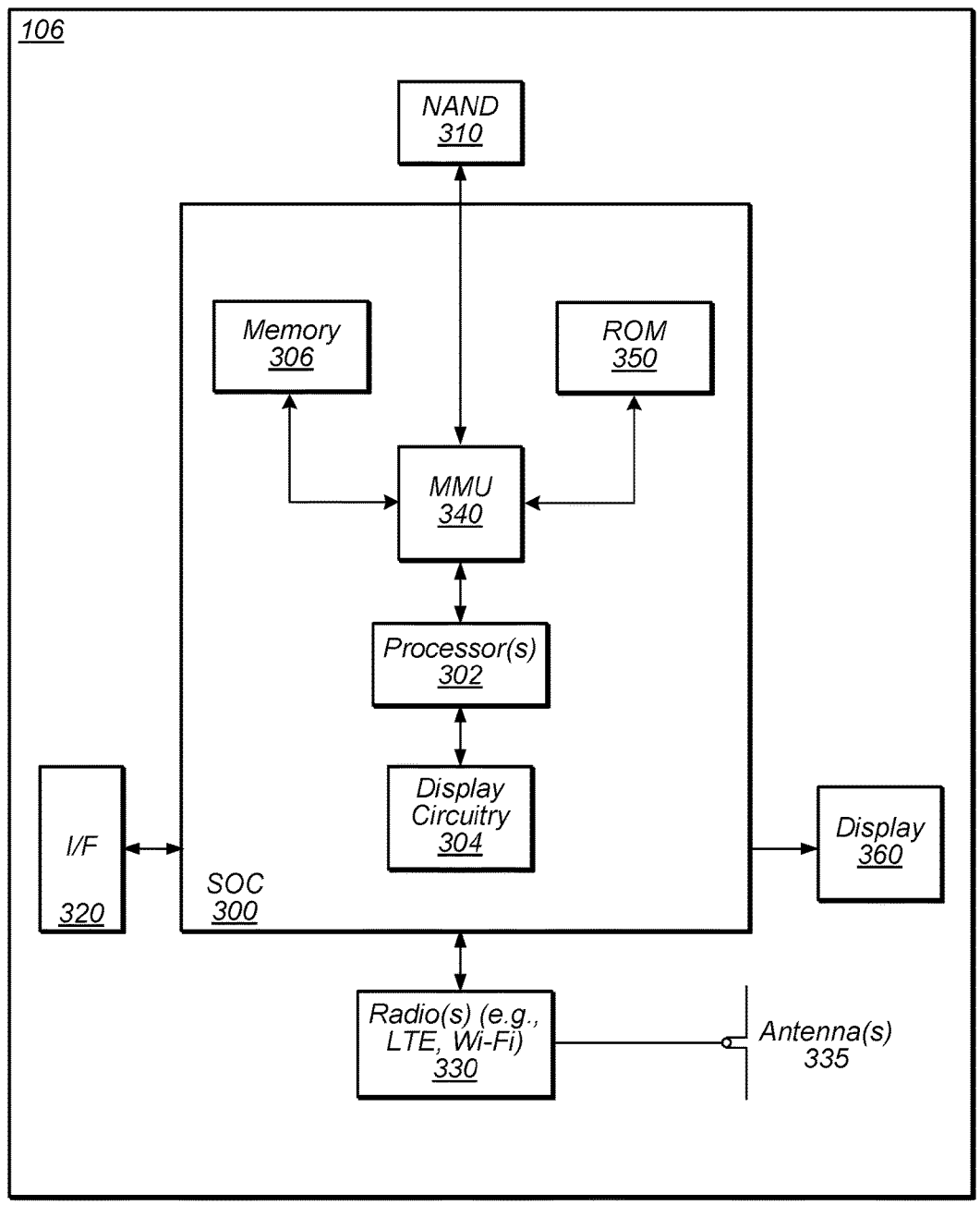
FIG. 3 illustrates an exemplary block diagram of a UE device, according to some embodiments.

FIG. 3—Exemplary Block Diagram of a UE

FIG. 3 illustrates an exemplary block diagram of a UE 106, according to some embodiments. As shown, the UE 106 may include a system on chip (SOC) 300, which may include portions for various purposes. For example, as shown, the SOC 300 may include processor(s) 302 which may execute program instructions for the UE 106 and display circuitry 304 which may perform graphics processing and provide display signals to the display 360. The processor(s) 302 may also be coupled to memory management unit (MMU) 340, which may be configured to receive addresses from the processor(s) 302 and translate those addresses to locations in memory (e.g., memory 306, read only memory (ROM) 350, NAND flash memory 310) and/or to other circuits or devices, such as the display circuitry 304, wireless communication circuitry 330, connector I/F 320, and/or display 360. The MMU 340 may be configured to perform memory protection and page table translation or set up. In some embodiments, the MMU 340 may be included as a portion of the processor(s) 302.

As shown, the SOC 300 may be coupled to various other circuits of the UE 106. For example, the UE 106 may include various types of memory (e.g., including NAND flash 310), a connector interface 320 (e.g., for coupling to a computer system, dock, charging station, etc.), the display 360, and wireless communication circuitry (e.g., radio) 330 (e.g., for LTE, Wi-Fi, GPS, etc.). Note that while the UE 106 is illustrated as including one or more radios separate from the SOC, it is also possible that one or more radios (or radio components) may be integrated into the SOC in addition or as an alternative, as an advanced SOC used in a UE may include embedded memory, processors, digital signal processing, and/or one or more (potentially different) radio(s) integrated into a single chip (generally in CMOS technology), e.g., for low power consumption and platform optimization. In other words, an SOC may also integrate a radio or multiple radios if desired, potentially including combination chips with any or all of Wi-Fi, Bluetooth, GPS, FM, and/or other communication capabilities.

The UE device 106 may include at least one antenna (and possibly multiple antennas, e.g., for MIMO and/or for implementing different wireless communication technologies, among various possibilities), for performing wireless communication with base stations and/or other devices. For example, the UE device 106 may use antenna(s) 335 to perform the wireless communication. As noted above, the UE 106 may be configured to communicate wirelessly using multiple wireless communication technologies in some embodiments.

As described further subsequently herein, the UE 106 may include hardware and/or software components for performing SC-FDMA communications, such as described herein with reference to, inter alia, FIG. 4. The processor 302 of the UE device 106 may be configured to implement part or all of the methods described herein, e.g., by executing program instructions stored on a memory medium (e.g., a non-transitory computer-readable memory medium). In other embodiments, processor 302 may be configured as a programmable hardware element, such as an FPGA (Field Programmable Gate Array), or as an ASIC (Application Specific Integrated Circuit). Alternatively (or in addition) the processor 302 of the UE device 106, in conjunction with one or more of the other components 300, 304, 306, 310, 320, 330, 335, 340, 350, 360 may be configured to implement part or all of the features described herein, such as the features described herein with reference to, inter alia, FIG. 4.

FIG. 4—Flowchart

Figure 4:
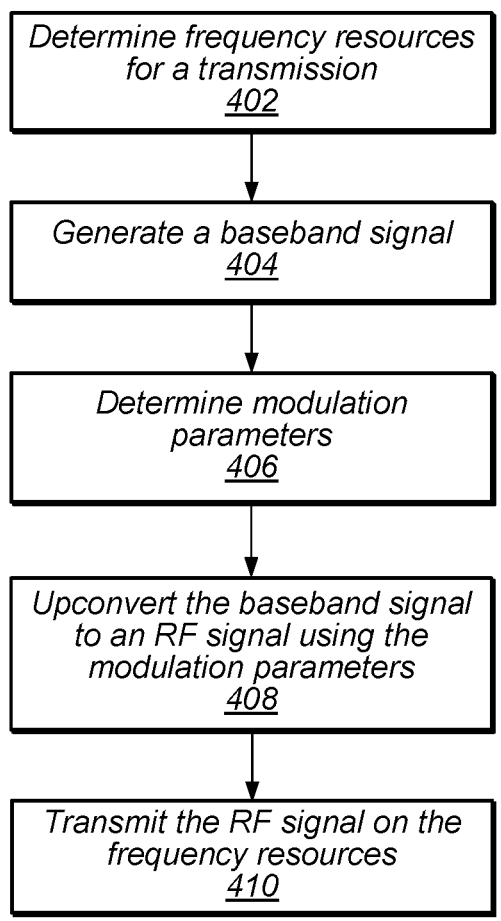
FIG. 4 is a communication flow diagram illustrating an exemplary method for performing an uplink transmission, according to some embodiments.

FIG. 4 is a flowchart diagram illustrating a method for generating and transmitting radio frequency (RF) waveforms. The method of FIG. 4 may be implemented by a UE 106 (e.g., such as illustrated in and described with respect to FIGS. 1-3), or more generally in conjunction with any of the computer systems or devices shown in the above Figures, among other devices, as desired.

In various embodiments, some of the elements of the method shown may be performed concurrently, in a different order than shown, substituted for by other elements, or may be omitted. Additional elements may also be performed as desired. As shown, the method may operate as follows.

In 402, frequency resources for a transmission may be determined. The frequency resources may include a signal bandwidth located around a particular frequency. The signal bandwidth may be less than the channel bandwidth of a frequency channel on which the transmission will be performed, and furthermore, at least in some instances, the frequency around which the frequency resources are centered may be offset from the center frequency of the frequency channel. For example, certain frequency resources of the frequency channel may be used for other purposes (e.g., for a cellular base station to communicate with other wireless devices, as one possibility) such that only a subset of the frequency resources of the frequency channel may be allocated to the UE.

For example, the UE may be configured to operate according to LTE, and the frequency resources may include one or more resource blocks (RBs) according to LTE. In such a case, the UE may first establish or join a cell according to LTE with a cellular base station. The cell may operate on a particular frequency channel having a particular bandwidth. As part of its cellular communication with the base station, then, the UE may receive an uplink grant for uplink LTE communication with the cellular base station. The uplink grant may include a RB allocation for a single carrier frequency division multiple access (SC-FDMA) uplink transmission, as may for example be typical in LTE. The RB allocation may be located around a frequency which is different than (e.g., shifted or offset from) the center frequency of the channel by a frequency offset.

In 404, a baseband signal may be generated. The baseband signal may have the determined signal bandwidth (e.g., depending on the number of RBs allocated), and may be positioned in frequency such that the frequency resources associated with the RB allocation are located around DC. In some embodiments, the center frequency of the frequency resources associated with the RB allocation may be located at or near DC, so that the center frequency of the frequency channel is offset from DC.

In other words, the baseband signal may be located around a first baseband frequency corresponding to the frequency around which the allocated frequency resources are located; a second baseband frequency corresponding to the center frequency of the frequency channel may be offset from the first baseband frequency.

The baseband signal may be generated as a cartesian baseband signal. The cartesian baseband signal may in turn be converted to a polar baseband signal; for example Cartesian to Polar conversion may be performed to convert the quadrature components I and Q of the baseband signal to a baseband phase portion and an amplitude portion.

In 406, modulation parameters for the transmission may be determined. At least in some instances, part of modulating the signal to be transmitted may include utilizing a phase locked loop (PLL) to upconvert the baseband phase portion to a RF phase signal. The transmission architecture may allow for the baseband phase signal to be injected to the PLL at any or all of multiple possible injection points. Thus, as one possibility, a modulation parameter that may be determined may include whether to use one point injection or two point injection to upconvert the baseband phase signal to a RF phase signal.

In some instances, the determined modulation parameters may additionally or alternatively include into which of the multiple possible injection points to inject the baseband phase signal. For example, the baseband phase signal could be injected at the PLL input (e.g., summed to the reference signal), or could be injected at the oscillator input (e.g., after a low pass filter and phase frequency detector).

The injection scheme used may be determined based on any of a variety of possible considerations. As one possibility, the bandwidth of the signal to be transmitted may be considered. For example, for wider bandwidths (e.g., above a bandwidth threshold), two point injection may be used. Two point injection may effectively provide an all-pass transfer function for the signal, potentially allowing for effective modulation of much wider bandwidth signals than conventionally possible using a PLL. For narrower bandwidth signals (e.g., below the bandwidth threshold), conversely, one point injection might be used.

In addition (or as an alternative) to the waveform width per se, the relative location of the frequency resources within the frequency channel on which the transmission is performed may affect the injection scheme used. For example, one injection point (e.g., an injection point prior to low pass filtering) may be used if the allocated frequency resources are within the PLL bandwidth range, while a different injection point (e.g., an injection point after low pass filtering) may be used if the allocated frequency resources are outside of the PLL bandwidth range.

At least in some instances, the modulation parameters may depend on a type of signaling being performed for the transmission. For example, control signaling (such as may be carried on the PUCCH) may have different modulation parameters than data signaling (such as may be carried on the PUSCH). This may be the case, for example, if the relative location of frequency resources for PUCCH and/or PUSCH communication are relatively consistent, such as in the case of SC-FDMA PUCCH transmissions that are typically located at or near the edge of the channel, at least according to some embodiments.

Note that, at least in some instances (e.g., if the allocated frequency resources are not centered in the frequency channel), the baseband phase signal may be shifted (e.g., digitally) in the temporal domain prior to injection into the PLL.

In 408, the baseband signal may be upconverted to a RF signal using the determined modulation parameters. For example, the baseband phase signal may be shifted (if appropriate), and may be injected at the selected injection point(s) to the PLL for upconversion, to produce a RF phase signal.

The RF phase signal may be amplified (e.g., according to the amplitude signal) to produde an RF signal. The amplification stage may be performed using a high efficiency power amplifier (HEPA). For example, the amplitude portion may either be converted to analog and used to control amplification using a switching power amplifier, or may remain digital and used to control amplification using a digital power amplifier, according to various embodiments. Furthermore, if desired, the amplitude portion may be encoded (e.g., delta-sigma modulation, thermometric, dynamic element matching, etc.) prior to driving a digital power amplifier.

Note further that, at least in some instances, it may be possible to implement an entirely digital RF front-end architecture through the power amplification stage. For example, using the above-described examples of a Polar RF architecture with a digital PA, a digital PLL, etc., it may be possible to provide an integrated circuit (e.g., CMOS chip) with both baseband and RF front end, which may be capable of implementing some or all of the method of FIG. 4.

Note additionally that, since in the method of FIG. 4 frequency shifting to allocated/determined frequency resources is performed after baseband processing and in the time domain, it may be the case (at least in some instances) that Fourier Transform (e.g., Discrete Fourier Transform (DFT) or Fast Fourier Transform (FFT)) and Inverse Fourier Transform (e.g., Inverse Discrete Fourier Transform (IDFT) or Inverse Fast Fourier Transform (IFFT)) may not be needed, and may thus not be performed (e.g., even in the case of a SC-FDMA signal) when generating the baseband signal. Up-sampling (and possibly interpolation) may be performed as an alternative technique to modify the sampling rate of the signal to an appropriate final sampling rate, if desired.

In 410, the RF signal may be transmitted. For example, the RF signal may be transmitted as an SC-FDMA signal as part of an uplink LTE communication in response to an uplink grant, such as previously described.

FIGS. 5-21—Additional Information

FIGS. 5-21 and the information provided herein below in conjunction therewith are provided by way of example of various considerations and details relating to possible systems with which the method of FIG. 4 may be implemented, and are not intended to be limiting to the disclosure as a whole. Numerous variations and alternatives to the details provided herein below are possible and should be considered within the scope of the disclosure.

Figure 5:
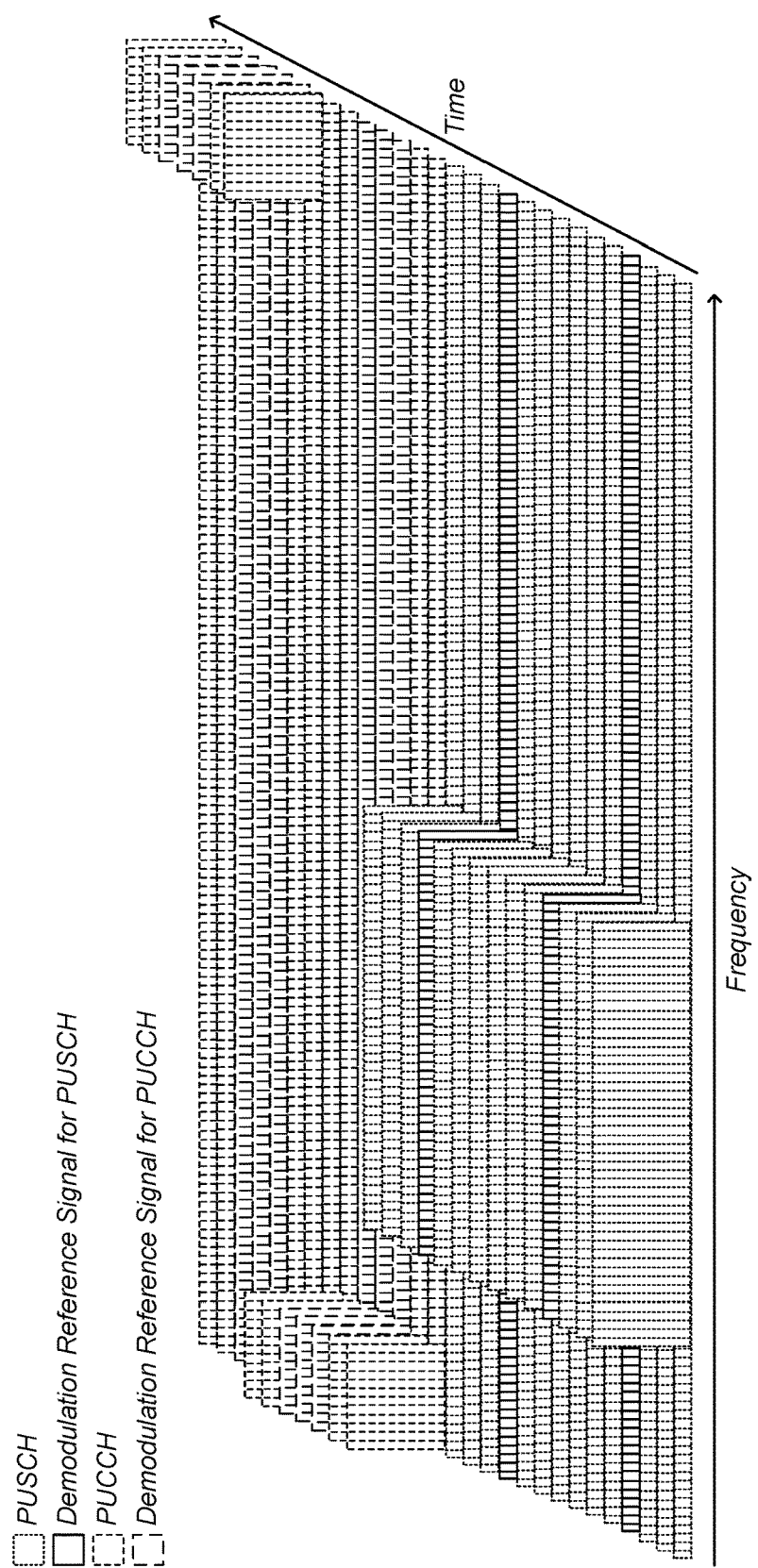
FIG. 5 illustrates a possible example of PUCCH and PUSCH time/frequency mapping, according to some embodiments.

FIG. 5 illustrates a possible example of PUCCH and PUSCH time/frequency mapping for a hypothetical UE device, according to some embodiments. As shown, PUCCH resources are available at the edges of total available cell bandwidth. Allocated PUCCH resources may jump from the lower edge of the bandwidth to the higher edge of the bandwidth and vice versa depending on the format. The PUCCH may carry UL Control Information (UCI). At least in some embodiments, the PUCCH may not be transmitted simultaneously with the PUSCH from the same UE device (e.g., according to LTE Release 8). The PUSCH may be used to carry user data. The number of Resource Blocks (e.g., units of 180 kHz) and their location in the channel may vary in time.

Figure 6:
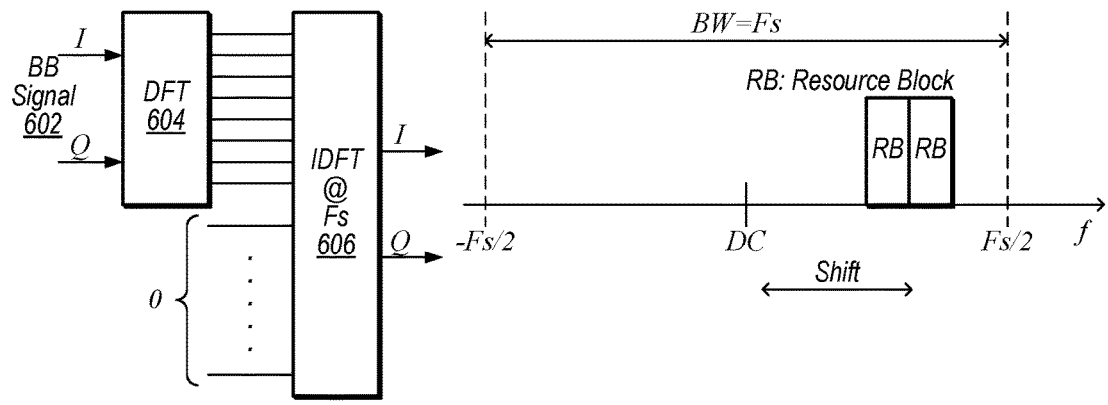
FIGS. 6-15 illustrate various exemplary aspects of possible transmission architectures, according to some embodiments.

FIG. 6 illustrates a typical SC-FDMA baseband configuration, according to some embodiments. As shown, a baseband (BB) signal 602 is input to a Discrete Fourier Transform (DFT) block 604. The signal frequency allocation (shift) to the frequency allocation imposed by the network is then performed in the frequency domain, before being input to an Inverse Discrete Fourier Transform (IDFT) block 606. In this case the final up-conversion to RF is performed using a local oscillator (LO) centered around the channel center frequency. Thus, although the baseband signal bandwidth could be much less than the channel bandwidth (e.g., 1 RB=180 kHz in LTE, while Fs=30.72 MHz for a 20 MHz channel), in this case after IDFT the data path has to deal with a potential maximum bandwidth equal to Fs (e.g., the channel bandwidth and the guard-bands).

Figure 7:
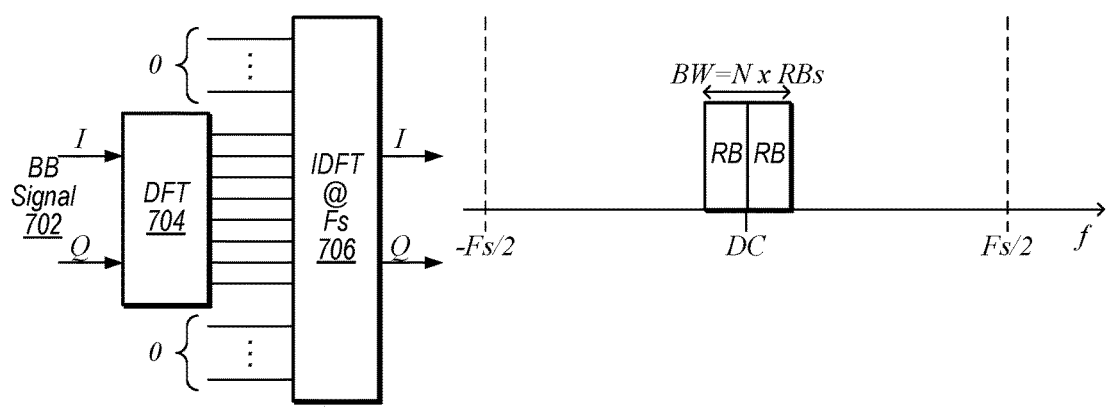

FIG. 7 illustrates an alternative SC-FDMA baseband configuration, such as might be used in conjunction with the method of FIG. 4, in some embodiments. As shown, a baseband signal 702 is input to a DFT block 704, but is not shifted in the frequency domain. Instead, the baseband signal remains located around DC (in this example, centered) as it is input to the IDFT block 706. Thus, in this case, the data path useful bandwidth depends only on the number of RBs rather than the full channel bandwidth. This may be much more efficient for digital signal processing (e.g., may reduce power consumption/conserve battery). The useful signal may then be shifted to the correct frequency position of the allocated RBs within the channel bandwidth after the IDFT (i.e., in the time domain).

Figure 8:
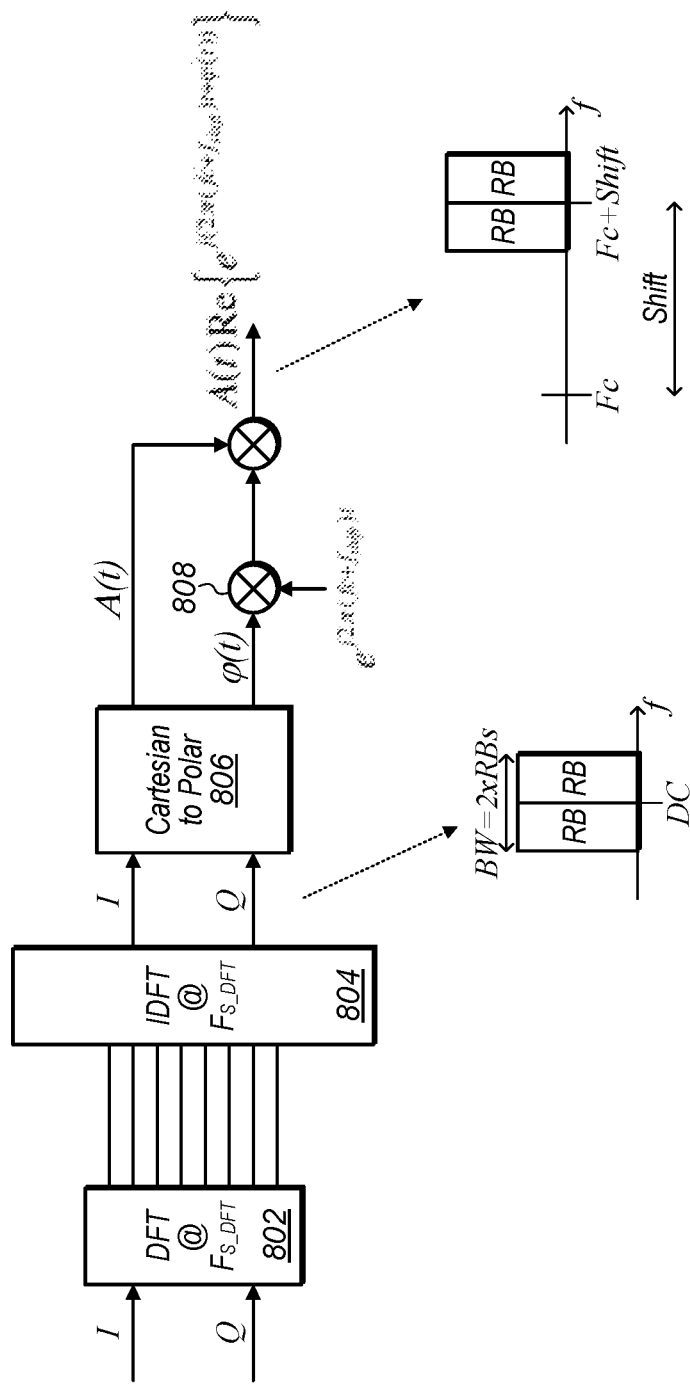

FIG. 8 illustrates a further configuration such as might be used in conjunction with the method of FIG. 4, in some embodiments. The illustrated configuration utilizes polar modulation and frequency shifting in the time domain. As shown, a baseband signal is input to a DFT block 802, and remains located around DC (in this example, centered) as it is input to the IDFT block 804. In this case, cartesian to polar conversion 806 may be performed, and the frequency shift 808 may be performed in the temporal domain after the IDFT 804. Note that the frequency shift may be applied to the phase signal while the amplitude signal remains located around DC.

Figure 9:
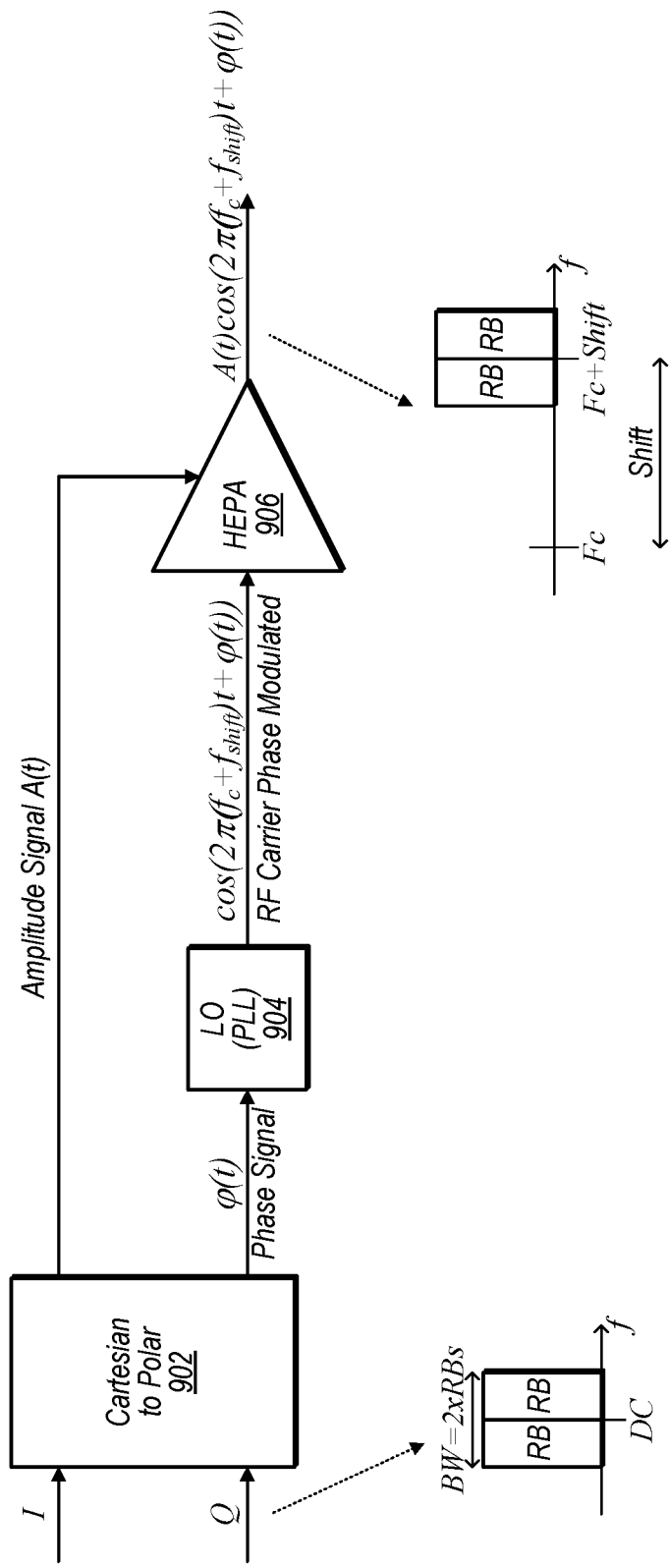

FIG. 9 illustrates further aspects of a configuration such as might be used in conjunction with the method of FIG. 4, in some embodiments. The illustrated configuration also utilizes polar modulation, in which a PLL is used to perform RF upconversion of the phase signal to the allocated frequency resources for the transmission. As shown, after cartesian to polar conversion 902, the phase signal may be provided to a PLL 904 for up-conversion. A high efficiency power amplifier (HEPA) 906 may be driven by a constant envelope signal carrying only phase modulation. Note that digital to analog to conversion (DAC) and quadrature mixers may not be needed for upconversion to RF in such an architecture (e.g., in contrast to conventional cartesian architecture implementations).

Figure 10:
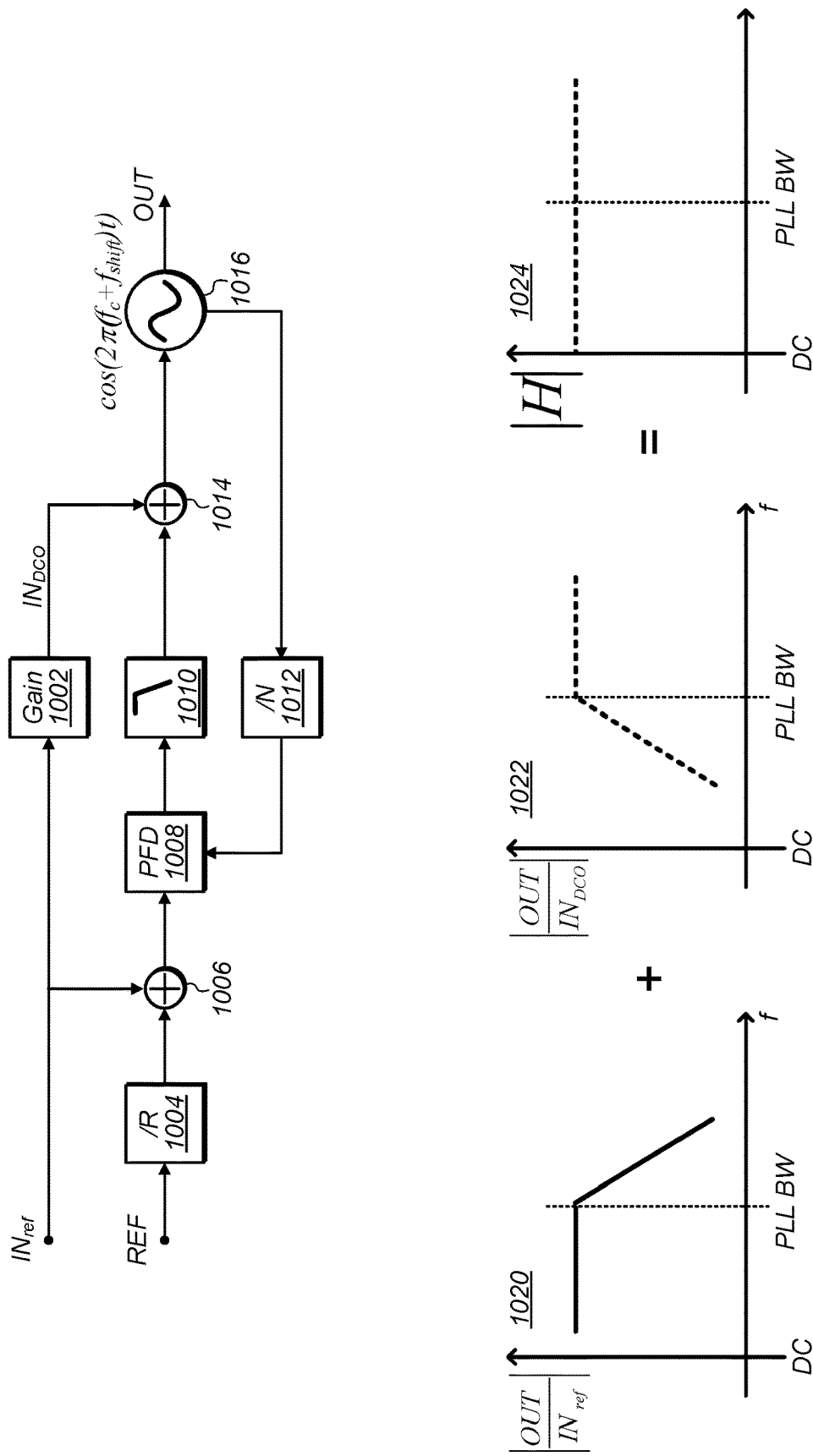

FIG. 10 illustrates still further aspects of a configuration such as might be used in conjunction with the method of FIG. 4, in some embodiments. The illustrated configuration includes an example of a possible two-point modulation of a PLL, according to some embodiments. An input signal may be summed 1006 with a reference signal 1004 at the PLL input (e.g, prior to phase frequency detection 1008 and low-pass filtering 1010). The input signal may also be injected 1014 at an oscillator 1016 (e.g., a digitally controlled oscillator (DCO) for a digital PLL or a voltage controlled oscillator (VCO) for an analog PLL). The output of the oscillator 1016 may be fed back to PFD 1008 by way of a divide by N block 1012. Note also that a gain block 1002 may be used to mitigate injection path gain difference.

Two point modulation such as according to the architecture illustrated in FIG. 10 may effectively provide an "all-pass" transfer function in order to overcome PLL bandwidth limitations. Conceptually, this may also be visualized in FIG. 10 as the low pass filtering 1020 performed on the signal injected at the PLL input may be combined with the high pass filtering 1022 of injecting the signal at the oscillator input to effectively produce an all pass signal 1024.

Figure 11:
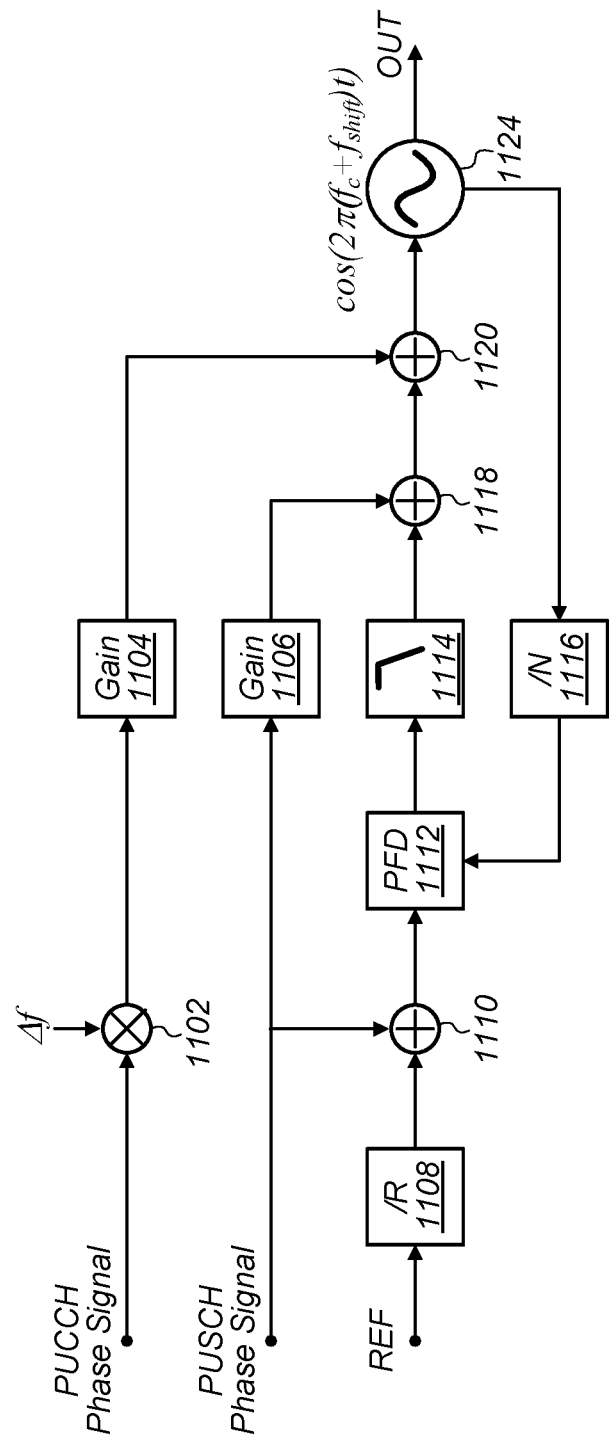

FIG. 11 illustrates yet further aspects of a configuration such as might be used in conjunction with the method of FIG. 4, in some embodiments. In particular, FIG. 11 illustrates elements of a transmission architecture in which either of two point injection or one point injection can be used with a PLL, e.g., depending on what type of signal is being transmitted.

Because PUSCH bandwidth can change and can be larger than the PLL bandwidth, the PUSCH phase signal may be injected using two point modulation of the PLL, with the PLL centered on the shifted frequency (i.e., the frequency around which the allocated resources are located).

The PUCCH bandwidth may be known, and may be located on the edge of the channel, which is much larger than the PLL bandwidth. Consequently, it may be possible to inject the PUCCH phase signal just at the oscillator input; the frequency may be shifted beforehand (depending on the size of the frequency shift).

Note that with such an architecture, it may be the case that there is no need to switch the PLL frequency between PUCCH and PUSCH transmissions.

Figure 12:
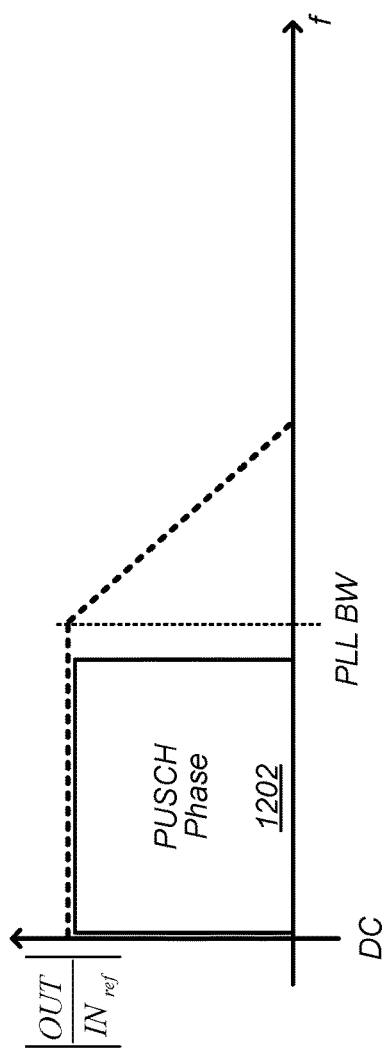
Figure 13:
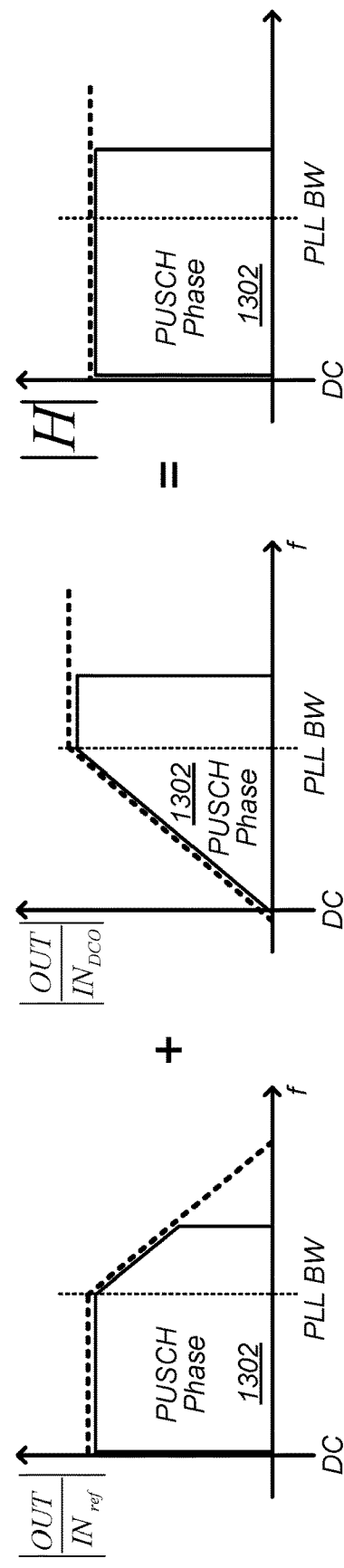

FIGS. 12-13 illustrate examples of possible PLL bandwidth effects on PUSCH phase signals. As shown in FIG. 12, in some instances it may be possible that the PLL bandwidth is larger than the PUSCH phase signal 1202 bandwidth. In this case, the PUSCH phase signal 1202 can be injected at the PLL input (summed to the reference signal) for one point injection.

However, if, as shown in FIG. 13, the PLL bandwidth is smaller than the PUSCH phase signal 1302 bandwidth, two point injection may be used to compensate for the effect of the PLL bandwidth.

Figure 14:
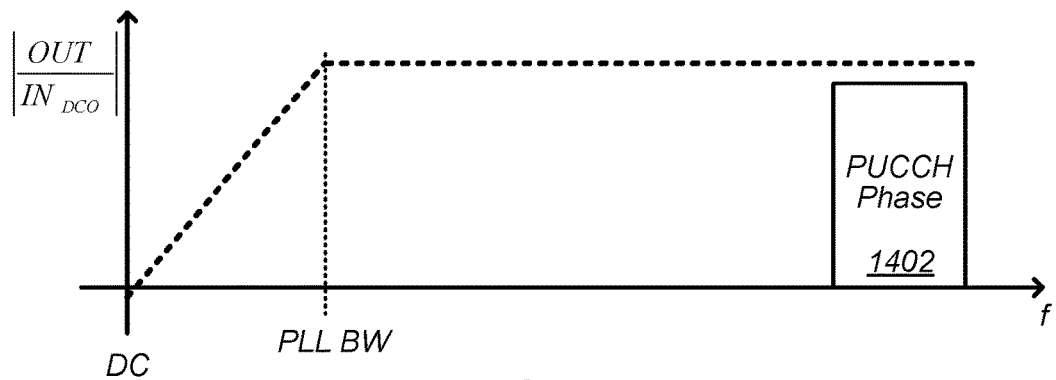

FIG. 14 illustrates an example of possible PLL bandwidth effects on PUCCH phase signals. As shown, the PUCCH phase signal 1402 may be at the edge of the channel (well beyond the PLL bandwidth). Accordingly, it may be possible to inject the PUCCH phase signal 1402 at the oscillator input to take advantage of the high-pass filtering, such that the PLL bandwidth does not affect the signal.

Figure 15:
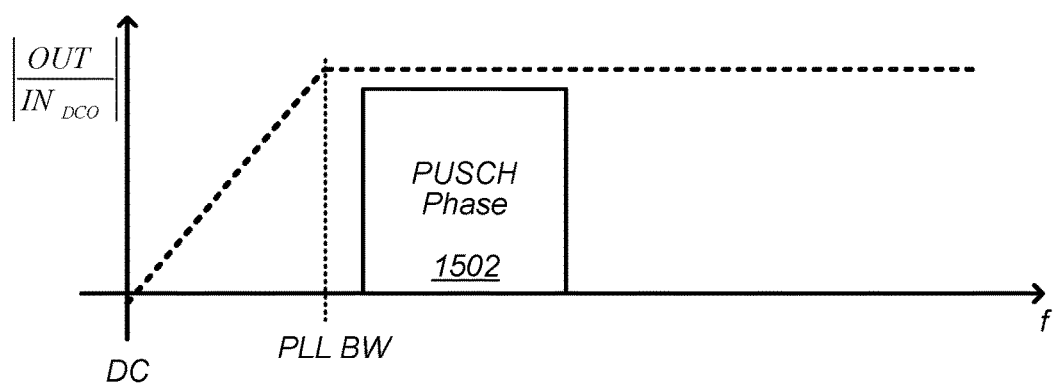

FIG. 15 illustrates that the same technique as described with respect to FIG. 14 may be used for a PUSCH phase signal 1502 if the PLL bandwidth is much smaller than the PUSCH phase signal bandwidth 1502.

Figure 16:
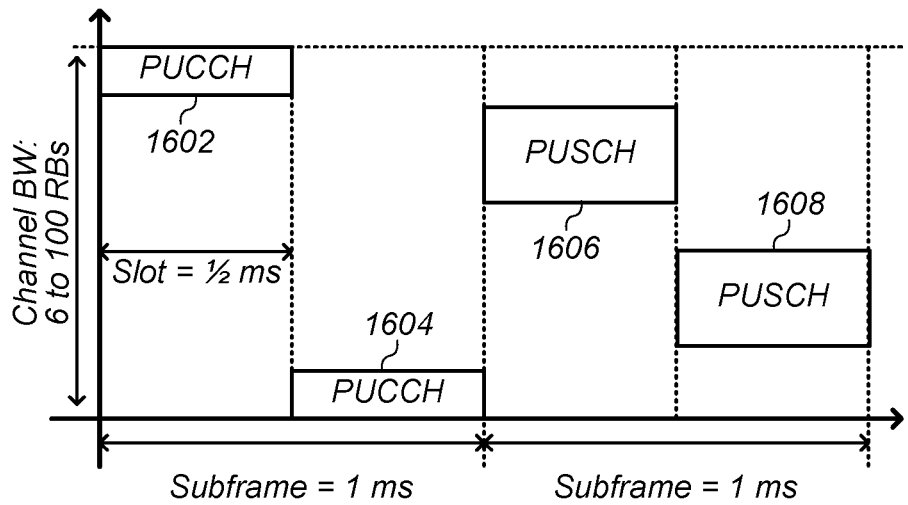
FIGS. 16-17 illustrate possible PUSCH and PUCCH frequency hopping schemes, according to some embodiments.
Figure 17:
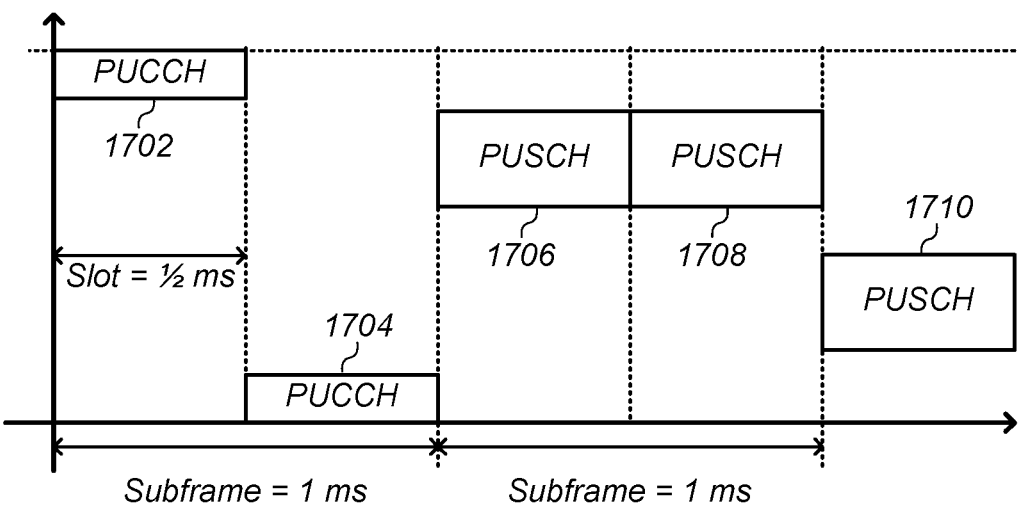

FIGS. 16-17 illustrate PUCCH and PUSCH frequency hopping schemes, according to some embodiments. As shown, the PUCCH transmissions 1602, 1604, 1702, 1704 may be frequency hopped at the slot boundary, i.e. every 0.5 ms (slot), e.g., for added reliability. Transmission of the PUCCH may jump from the lower edge of the bandwidth to the higher edge of the bandwidth, and vice versa, depending on the format.

For PUSCH transmissions 1606, 1608, 1706, 1708, 1710, frequency hopping is also an option. In this case, the frequency hopping can be intra-subframe (slot) (e.g., similar to the PUCCH, as illustrated in FIG. 16) or inter-subframe (1 ms, e.g., as illustrated in FIG. 17).

Figure 18:
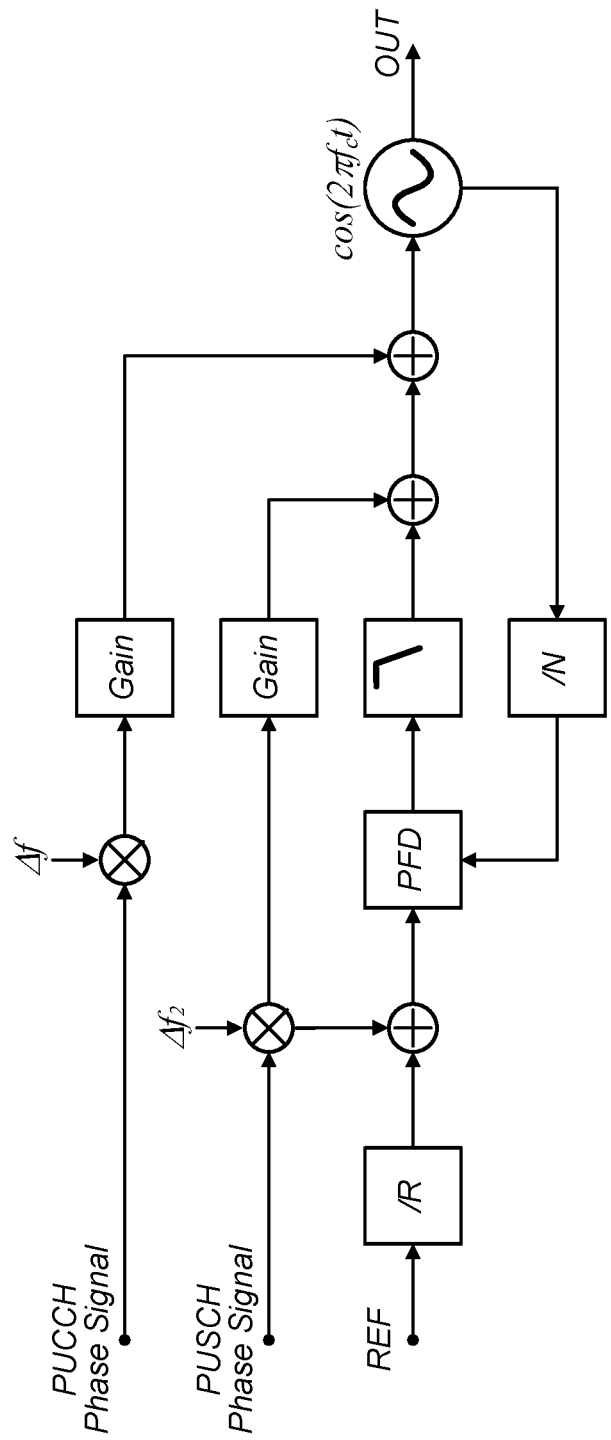
FIGS. 18-22 illustrate various further exemplary aspects of possible transmission architectures, according to some embodiments.

FIG. 18 illustrates further additional elements of a configuration such as might be used in conjunction with the method of FIG. 4, in some embodiments. In particular, FIG. 18 illustrates elements of a transmission architecture in which either of two point injection or one point injection can be used with a PLL, e.g., depending on what type of signal is being transmitted. The architecture of FIG. 18 may be used in conjunction with PUSCH and/or PUCCH frequency hopping schemes, if desired. In this example, the frequency hopping for both PUCCH and PUSCH may be performed in the temporal domain by frequency shifting the phase signals. Note that the PUCCH and PUSCH amplitude signals may not be shifted and may remain located around DC. In this example, the PLL frequency may be fixed (e.g., as the frequency hopping and shift may be performed prior to the PLL centered to the carrier frequency). This may improve performance, in some embodiments, as shifting PLL oscillator frequency may be difficult to achieve with the timing resolution needed to implement frequency hopping schemes.

Figure 19:
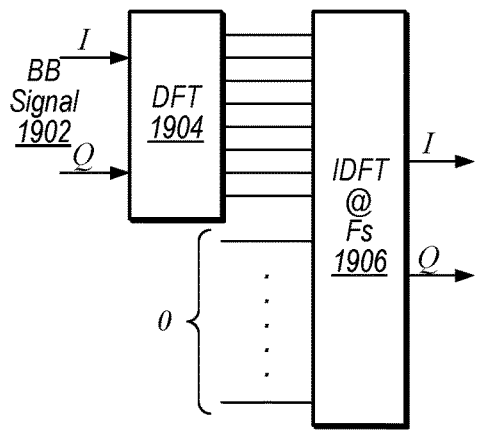

FIGS. 19-22 illustrate further the contrast between performing a frequency shift in the frequency domain and in the time domain, as well as further possibilities for architecture modifications. FIG. 19 illustrates a classical SC-FDMA arrangement in which the baseband signal 1902 is shifted in the frequency domain such that the useful signal is not centered around DC after IDFT 1906. In this case, in order to be able to perform the frequency shift of the RBs and to place the control channels in the frequency domain before the IDFT 1906, the IDFT 1906 size is greater than the DFT 1904 size. Accordingly, to get the same frequency solution (i.e., the same subcarrier spacing), the IDFT 1906 sampling rate may accordingly be higher than the DFT 1904 sampling rate. As a result, the peak-to-average-power (PAPR) ratio of the original baseband signal may be increased, impacting the transmit path linearity requirement.

Figure 20:
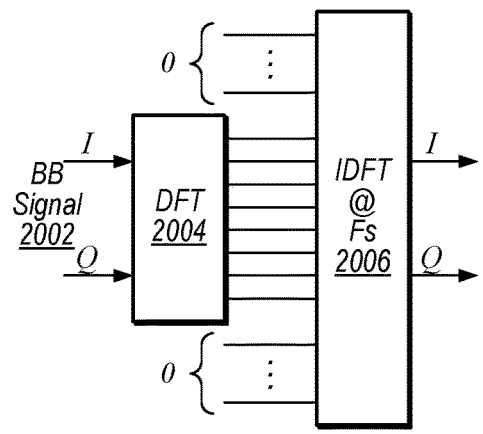

FIG. 20 illustrates an SC-FDMA arrangement in which the baseband signal 2002 is not shifted in the frequency domain such that the useful signal is centered around DC after IDFT 2006, as might be the case if the frequency shift were to be performed in the time domain by a LO in the RF front end, for example. Note that in such a case, since the RBs and the control channels are centered around DC, and the frequency shift is performed in the temporal domain after the IDFT 2006, it may be possible for the IDFT 2006 and the DFT 2004 blocks to be the same size and have the same sampling rate.

Figure 21:
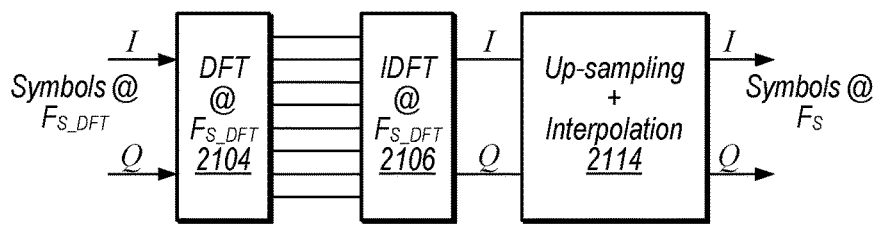

Such an arrangement with DFT 2104 and IDFT 2106 having the same size is illustrated in FIG. 21. In this case, up-sampling (and possibly interpolation) 2114 may be needed after the IDFT 2106 in order to achieve the final sampling rate Fs.

Figure 22:
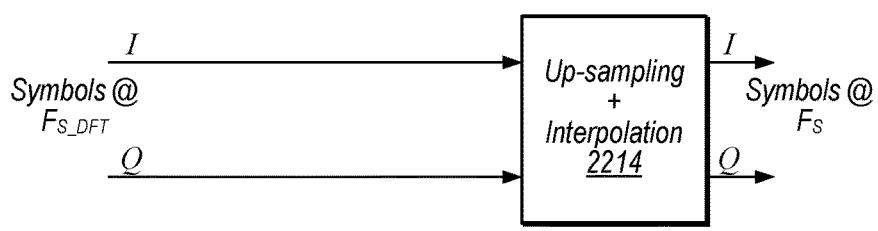

Furthermore, since the DFT and the IDFT in such a case would have the same length, they may effectively cancel each other out, and may be discarded altogether as extraneous. FIG. 22 illustrates such an arrangement, in which baseband SC-FDMA signal is not subject to DFT or IDFT, but is simply provided to an up-sampling and interpolation block 2214 to generate a signal having the final sampling rate Fs before being provided to the RF front end.

In addition to the above-described exemplary embodiments, further embodiments of the present disclosure may be realized in any of various forms. For example some embodiments may be realized as a computer-implemented method, a computer-readable memory medium, or a computer system. Other embodiments may be realized using one or more custom-designed hardware devices such as ASICs. Still other embodiments may be realized using one or more programmable hardware elements such as FPGAs.

In some embodiments, a non-transitory computer-readable memory medium may be configured so that it stores program instructions and/or data, where the program instructions, if executed by a computer system, cause the computer system to perform a method, e.g., any of a method embodiments described herein, or, any combination of the method embodiments described herein, or, any subset of any of the method embodiments described herein, or, any combination of such subsets.

In some embodiments, a device (e.g., a UE 106) may be configured to include a processor (or a set of processors) and a memory medium, where the memory medium stores program instructions, where the processor is configured to read and execute the program instructions from the memory medium, where the program instructions are executable to implement any of the various method embodiments described herein (or, any combination of the method embodiments described herein, or, any subset of any of the method embodiments described herein, or, any combination of such subsets). The device may be realized in any of various forms.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:
1. An apparatus, comprising:
digital baseband and radio frequency (RF) circuitry configured to:
determine frequency resources allocated for an uplink transmission;
determine whether the allocated frequency resources are located around a frequency shifted from a center frequency of a frequency channel in which the frequency resources are located;
generate a cartesian baseband signal for the uplink transmission;
convert the cartesian baseband signal to a polar baseband signal, the polar baseband signal comprising a baseband phase signal and an amplitude signal;
determine modulation parameters for the uplink transmission, wherein determining the modulation parameters comprise at least selecting one or more injection points into which to inject the baseband phase signal into a phase locked loop (PLL) to upconvert the baseband phase signal to a RF phase signal;

shift the baseband phase signal in a temporal domain prior to injection into the PLL if the allocated frequency resources are located around a frequency shifted from the center frequency of the frequency channel in which the frequency resources are located; and upconvert the baseband phase signal to the RF phase signal according to the determined modulation parameters.

2. The apparatus of claim 1, wherein selecting the one or more injection points is based at least in part on a type of the uplink transmission, wherein the type of the uplink transmission comprises one of:

a control signaling transmission; or a data signaling transmission.

3. The apparatus of claim 1, wherein the digital baseband and RF circuitry is further configured to:

determine a bandwidth of the frequency resources allocated for the uplink transmission;

select two injection points into which to inject the baseband phase signal if the determined bandwidth is above a bandwidth threshold; and select one injection point into which to inject the baseband phase signal if the determined bandwidth is below the bandwidth threshold.

4. The apparatus of claim 3, wherein if the determined bandwidth is below the bandwidth threshold, the digital baseband and RF circuitry is further configured to:

select the one injection point into which to inject the baseband phase signal further based on a relative location of the allocated frequency resources within a frequency channel in which the allocated frequency resources are located.

5. The apparatus of claim 1, wherein generating the cartesian baseband signal does not include performing a Fourier transform or inverse Fourier transform, wherein the digital baseband and RF circuitry is further configured to:

perform up-sampling and interpolation of the cartesian baseband signal to modify a sampling rate of the cartesian baseband signal prior to converting the cartesian baseband signal to the polar baseband signal.

6. The apparatus of claim 1, wherein the digital baseband and RF circuitry comprises a complementary metal oxide semiconductor (CMOS) chip.

7. The apparatus of claim 1, wherein the amplitude signal remains located around DC.

8. A method for operating a wireless user equipment (UE) device, the method comprising:

determining frequency resources allocated for an uplink transmission, wherein the allocated frequency resources are located around a frequency shifted from a center frequency of a channel in which the frequency resources are located;

generating a cartesian baseband signal for the uplink transmission;

converting the cartesian baseband signal to a polar baseband signal, the polar baseband signal comprising a baseband phase signal and an amplitude signal;

determining modulation parameters for the uplink transmission, wherein the modulation parameters comprise at least whether to use a one point injection phase locked loop (PLL) or a two point injection PLL to upconvert the baseband phase signal to a radio frequency (RF) phase signal;

shifting the baseband phase signal in a temporal domain prior to injection into the PLL;

upconverting the baseband phase signal to the RF phase signal according to the determined modulation parameters;

amplifying the RF phase signal according to the amplitude signal to produce an RF signal; and transmitting the RF signal.

9. The method of claim 8, wherein the modulation parameters are determined based at least in part on a type of the uplink transmission, wherein the type comprises one of:

control signaling; or data signaling.

10. The method of claim 8, wherein the modulation parameters are determined based at least in part on the frequency resources allocated for the uplink transmission.

11. The method of claim 8, wherein the uplink transmission comprises a single carrier frequency division multiple access (SC-FDMA) uplink transmission according to LTE, wherein the allocated frequency resources comprise an allocation of resource blocks (RBs) for one of a physical uplink control channel (PUCCH) transmission or a physical uplink shared channel (PUSCH) transmission.

12. The method of claim 8, wherein generating the cartesian baseband signal does not include performing a Fourier transform or inverse Fourier transform, wherein the method further comprises:

performing up-sampling and interpolation of the cartesian baseband signal to modify a sampling rate of the cartesian baseband signal prior to converting the cartesian baseband signal to the polar baseband signal.

13. A wireless user equipment (UE) device, comprising:

an antenna;

a radio coupled to the antenna; and a processing element coupled to the radio;

wherein the antenna, radio, and processing element are configured to:

determine frequency resources allocated for an uplink transmission;

determine whether the allocated frequency resources are located around a frequency shifted from a center frequency of a channel in which the frequency resources are located;

generate a polar baseband signal associated with the uplink transmission, the polar baseband signal comprising a baseband phase signal and an amplitude signal;

select one or more injection points of a phase locked loop (PLL) into which to inject the polar baseband signal;

perform temporal domain shifting of the baseband phase signal prior to injection into the PLL if the allocated frequency resources are determined to be located around a frequency shifted from a center frequency of a channel in which the frequency resources are located;

upconvert the baseband phase signal to a radio frequency (RF) phase signal using the PLL, wherein upconverting the baseband phase signal to the RF phase signal using the PLL comprises injecting the baseband phase signal to the PLL at the selected one or more injection points;

amplify the RF phase signal according to the amplitude signal to produce an RF signal; and transmit the RF signal.

14. The UE device of claim 13,
wherein selecting the one or more injection points of the PLL into which to inject the polar baseband signal comprises selecting from:
a first injection point at an input of the PLL prior to low pass filtering and phase frequency detection;
a second injection point at an input of the PLL after low pass filtering and phase frequency detection; or
both the first injection point and the second injection point.

15. The UE device of claim 13,
wherein the one or more injection points of the PLL are selected based at least in part on a type of the uplink transmission.

16. The UE device of claim 13, wherein the one or more injection points of the PLL are selected based at least in part on the frequency resources allocated for the uplink transmission.

17. The UE device of claim 13, wherein the uplink transmission comprises a single carrier frequency division multiple access (SC-FDMA) uplink transmission according to LTE, wherein the allocated frequency resources comprise an allocation of resource blocks (RBs) for one of a physical uplink control channel (PUCCH) transmission or a physical uplink shared channel (PUSCH) transmission.

18. The UE device of claim 13, wherein the UE device is further configured to:
generate a cartesian baseband signal for the uplink transmission; and
convert the cartesian baseband signal to the polar baseband signal.

19. The UE device of claim 13,
wherein the one or more injection points of the PLL are selected based at least in part on whether the uplink transmission comprises control signaling.

20. The UE device of claim 13,
wherein the amplitude signal is not shifted.

* * * * *